United States Patent [19]
Partin

[11] Patent Number: 5,561,079
[45] Date of Patent: Oct. 1, 1996

[54] STALAGRAPHY

[75] Inventor: Dale L. Partin, Ray, Mich.

[73] Assignee: General Motors Corporation, Detroit, Mich.

[21] Appl. No.: 357,900

[22] Filed: Dec. 16, 1994

[51] Int. Cl.$^6$ ............................................. H01L 21/20
[52] U.S. Cl. ........................ 437/90; 437/132; 437/133; 437/233
[58] Field of Search ........................ 437/90, 132, 133, 437/233

[56] References Cited

U.S. PATENT DOCUMENTS

| | | | |
|---|---|---|---|
| 5,038,131 | 8/1991 | Olk et al. | 338/32 R |
| 5,240,558 | 8/1993 | Kawasaki et al. | 437/233 |
| 5,393,373 | 2/1995 | Jun et al. | 437/233 |
| 5,427,974 | 6/1995 | Lur et al. | 437/233 |
| 5,447,873 | 9/1995 | Randall et al. | 437/90 |

OTHER PUBLICATIONS

Goldstein et al "Melting in Semiconductor Nanocrystals" in Science, vol. 256, Jun. 1992, pp. 1425–1427.

Heremans, "Solid State Magnetic Field Sensors and Applications", *J. Phys. D: Appl. Phys.* 26 (1993), pp. 1149–1158.

Isu et al, "Real–Time μ–RHEED Observations of GaAs Surfaces During Growth with Alternating Source Supply", *Journal of Crystal Growth* 111 (1991), pp. 210–215.

Isu et al, "Real Time μ–RHEED Observations of III–V Growth During Molecular Beam Epitaxy", *Gallium Arsenide and Related Compounds 1992*, IOP Publishing Ltd. (1993), pp. 381–386.

Koguchi et al, "Growth of GaAs Epitaxial Microcrystals on an S–Terminated GaAs Substrate by Successive Irradiation of Ga and As Molecular Beams", *Jpn. Journal of Applied Physics*, vol. 32 (1993), Part 1, No. 5A, pp. 2052–2058.

Koguchi et al, "New Selective Molecular–Beam Epitaxial Growth Method for Direct Formation of GaAs Quantum Dots", *J. Vac. Sci. Technol. B*, vol. 11, No. 3 (1993), pp. 787–790.

Maximov et al, "Fabrication of Quantum Dot Structures Using Aerosol Deposition and Plasma Etching Techniques", *J. Vac. Sci, Technol. A*, vol. 11, No. 4 (1993), pp. 748–753.

Morishita et al, "Real–Time μ–RHEED Observations of Droplets of GaAs (111)B Surfaces During Growth with Alternating Source Supply", *Journal of Crystal Growth* 127 (1993), pp. 999–1004.

Partin et al, "Growth and Characterization of Indium Antimonide Doped with Lead Telluride", *Journal of Applied Physics*, vol. 71, No. 5 (1992), pp. 2328–2332.

Shen et al, "Arsenic Pressure Dependence of the Surface Diffusion in Molecular Beam Epitaxy on (111)B–(001) Mesa–Etched GaAs Substrates Studied by In Situ Scanning Microprobe Reflection High–Energy Electron Diffraction", *Jpn. Journal of Applied Physics*, vol. 32 (1993), pp. L1117–L1119.

*Primary Examiner*—Robert Kunemund
*Assistant Examiner*—Ramamohan Rao Paladugu
*Attorney, Agent, or Firm*—George A. Grove

[57] ABSTRACT

A method of lithography is disclosed for making very small structures ($10^{-6}$ m and smaller) on a surface such as in the manufacture of semiconductor devices. Many micron-sized or smaller droplets of a suitable material are formed on the surface, and the droplets are used for forming structures on or holes in the surface and thus are the basis for the shape and location of the structures.

18 Claims, 3 Drawing Sheets

STALAGRAPHY

This invention pertains to a process for producing micron- or submicron-sized structures, and more specifically it relates to a lithographic process for producing semiconductor structures using micron- or submicronsized droplets formed on a surface of a suitable material.

BACKGROUND OF THE INVENTION

Lithography of small semiconductor structures is generally a difficult, time consuming and expensive process, especially as one moves from microlithography to the submicron regime of nanolithography. There have been a number of approaches to attaining submicron dimensions, which include ex-situ processes such as deep ultraviolet, x-ray or electron beam lithography using a layer of an appropriate "resist" material. There are other approaches involving in-situ processes (i.e., processes in which a film is patterned during film growth or immediately before or after film growth, inside the growth chamber). These in-situ processes include patterning with focused ion beams and growth of quantum wires using "serpentine superlattices". However, there remains a great need for a process of general applicability that can reliably and relatively inexpensively produce semiconductor structures of, e.g., 100 to 1000 nanometer size on a desired surface.

SUMMARY OF THE INVENTION

The invention will be illustrated in terms of the forming of semiconductor structures. However, it is to be understood that this process is broadly applicable to the formation of other very small structures. A material, such as a low melting point material, is evaporated onto the surface of a substrate or of an underlying film, which was previously deposited onto a substrate, under conditions in which the material forms very small droplets on the surface. These droplets are then used to do lithography of very small structures. The term "droplets" will be used here to refer to them whether they are in the liquid or solid state.

The droplets may be used to pattern the underlying film by several means. In one example, the droplets remain on the surface and are part of the finished structure or device (a positive structural element). As such, they may form ohmic contacts, Schottky barrier contacts, field emitters, p/n junctions, doped or alloyed regions, or carrier scattering centers. The droplets may do this to the "top" film upon which they are deposited and/or to a second, "bottom" film which is underneath the top film. They do this by diffusing through or by dissolving part of the film under them, enabling them to "punch through" to the second, deeper film. The top film may be highly resistive or of opposite conductivity type from that of the bottom, conductive film. If a layer of metallization is then deposited over this structure, it allows the top surfaces of all of the droplets to be connected together.

In a different process approach, the droplets may be etched away with a selective chemical etch before deposition of the final metallization layer mentioned, which then forms appropriate contacts in the holes (i.e., a negative structural element) left by the droplets and simultaneously connects them together. In another example of how droplets may be processed, some of the underlying film may be dissolved by the droplets, and then the droplets may be etched away with a selective chemical etch, thus leaving holes in the film. In another example, a layer of a masking material is deposited over the droplets and the underlying film. After a suitable heat treatment, the droplets are then removed by chemical etching, removing the masking material over the droplets and leaving it behind elsewhere. A "wet" or "dry" chemical etch may then be used to remove some of the underlying film where it is not masked, creating deeper holes in it. The masking material may then be removed, if desired. Alternatively, the masking material may be left in place and another material, such as a ferromagnetic material or an ohmic or rectifying contact material, may be deposited over it. The masking material may then be chemically etched off if desired, lifting off the ferromagnetic material with it except in the positions previously occupied by the droplets. A variant of the above is that the masking material may be formed by reaction of the surface of the exposed underlying film with a liquid, gaseous or plasma species (including an ion implanted species) to form another compound (e.g., an oxide). Alternatively, a high resistivity layer may be formed by damaging the surface of the underlying film (e.g., by ion implantation of H or Ar into GaAs and its alloys). In either case, processes similar to those discussed above in connection with a "masking material" may then be carried out, if desired. If the top surface of the droplets becomes oxidized, it may still be adequately conductive, since the oxides of some relevant metals, such as In, Pb and Sn, may be suitably conductive.

In the previous paragraph, fabrication of negative structural elements (i.e., holes in the underlying film or layer) were fabricated by forming droplets by the stalagraphy process at a temperature where the droplets dissolve some of the underlying film. The droplets are then removed by a wet or dry chemical etch. Wet etches would generally be done outside the deposition chamber and usually would involve exposure to air and water. Dry etches (involving, e.g., chlorine) could be done with an intermediate air exposure or without air exposure by transfer to an attached dry etching chamber. Two other techniques are possible for removing the droplets which may be done without air exposure. In one of them, after the droplets are condensed at a given temperature, the sample is heated to a higher temperature, thus increasing the surface diffusion rate of the droplet material and enabling the droplet materials to condense in a smaller number of larger droplets, and leaving holes behind. This is illustrated in more detail in Example 3 below. In another technique for removing droplets without air exposure, the droplets are condensed from a material of relatively high vapor pressure. The droplets then slowly evaporate, leaving holes behind where the droplets had resided. Material from the underlying substrate which had been dissolved in the droplet may evaporate with the droplet or be dispersed on the surface of the underlying substrate, leaving a hole where the droplet had been. Potential droplet materials with appreciable vapor pressure s include, but are not limited to, Pb, Bi, Sb, Tl, Zn, Cd, Mg and Hg. Use of this technique with relatively high melting point underlying films and/or substrates such as silicon or ceramics might enable somewhat lower vapor pressure droplet materials to be used such as Ga, In, Sn and Ge. In any of these techniques for producing holes in the underlying film, it may be desirable to then deposit another film over the underlying film. The ability to do this without exposure to air, water, etc., is often advantageous.

In another example, the droplets serve as a mask while a wet or dry chemical etch is used to remove some or all of the exposed underlying film, leaving the underlying film intact under the droplets. The droplets may then be removed from the remaining underlying film if desired, or they may be left on the sample until they have served as a mask for another material which may be deposited over the sample or formed by reaction with the sample. The droplets may be left on the sample and become part of the final device, serving as electrical contacts. These processes effectively define quantum "wires" or "dots", depending upon the structure which is grown and upon subsequent processing. In an appropriate material, such quantum wires may be magnetic field sensors, and quantum dots (also called "boxes") may be efficient light emitters because of the modified electronic density of states in such a confined structure.

The droplets may also be used to dope the underlying film and any subsequently deposited film n-type or p-type. For example, Sn droplets would dope many III–V compounds n-type, such as InSb and GaAs. Zn and Cd droplets could dope them p-type. Group III droplets such as Al, Ga, In and Tl dope Si and Ge p-type, whereas group V droplets, such as Sb and Bi, dope them n-type. The doping may occur by diffusion of the droplet species at low concentration into the adjacent film or by dissolving some of the adjacent film, and then, as the sample is cooled, some of the film may deposit out of solution onto adjacent surfaces. The deposited film would be doped with the droplet material. A similar process may be used to change the composition of the main constituents of the materials adjacent to the droplets. For example, reactions between Al, Ga, Tl, or Bi droplets and InSb or InAs could be used to form a thin layer of ternary compound adjacent to each droplet. The droplets may also serve as a mask for ion implantation or diffusion of a species into the underlying film.

The emphasis of the present invention is on using the droplets to define or modify small structures (including holes) in the underlying and/or subsequently deposited film using a wide variety of techniques. Some of these techniques serve to define which region of the underlying film or substrate is contacted, etched, reacted, coated, modified, aligned, etc. These processes can, in general, use the droplets in a manner analogous to positive or negative photoresist. These various processes for using droplets to define or modify small structures are herein referred to as "stalagraphy." This word is derived from the Greek stalagma, "drop", and graphikos, "write", hence, "writing with droplets". The diameters of the droplets can range from less than 100 nanometers to 1000 nanometers or larger. They are preferably formed at a density of about $10^6$ to $10^{10}$ droplets per square centimeter. Thus, the writing can be of very small but extremely useful structures.

The present invention concerns a lithography technique for producing new materials and structures. It also includes ways to use it to make useful devices such as magnetic field sensors and light emitting devices. The variations of stalagraphy discussed here generally concern two-dimensional lithography on a surface on which droplets are fabricated. However, a three-dimensional lithography process can be created in which droplets are repeatedly formed and then overgrown with an additional film. While a number of variations have been discussed above and will be discussed below, it appears that stalagraphy is such a general, powerful technique that it may be useful with a nearly limitless number of processes or combinations of processes.

DESCRIPTION OF THE DRAWINGS

FIGS. 4A and 4B are cross-sectional views of magnetic field sensor structures incorporating quantum wire structures. In FIG. 4A a top metal "plate" is used to contact the top of each wire. In FIG. 4B a dielectric layer and a metal layer are used to contact the top of each wire.

DESCRIPTION OF THE PREFERRED EMBODIMENT

Some experiments have been done to illustrate the mechanisms and variations of stalagraphy in the context of a particular material system, InSb, which is useful for magnetic field sensors because of its high room temperature electron mobility.

EXAMPLE 1

Films of epitaxial InSb were grown by molecular beam epitaxy (MBE) on approximately (100) oriented InP substrates using techniques similar to those published by D. L. Partin, J. Heremans and C. M. Thrush in J. Appl. Phys., Vol. 71, No. 2328 (1992). The films were grown at a substrate temperature of 300° C. Growth was then interrupted, and the sample temperature was changed. Indium (In) was then deposited, typically in an amount to provide an average thickness of 2.0 nm over the entire InSb film surface in a time of 4.0 minutes. The sample was then cooled to room temperature and removed from the MBE system. Scanning electron microscopy (SEM) was then used to determine the droplet areal density and average diameter, and this data is given in Table 1.

TABLE 1

Characteristics of indium droplets deposited on InSb versus deposition temperature

| Sample Number | Average In Thickness (nm) | Deposition Temp. (°C.) | Droplet Diameter (nm) | Areal Density ($10^7$ cm$^2$) |
| --- | --- | --- | --- | --- |
| 1553 | 2.0 | 300 | 320 | 2.2 |
| 1551 | 8 | 300 | 570 | 2.4 |
| 1561 | 2.0 | 250 | 310 | 1.8 |
| 1559 | 2.0 | 170 | 170 | 18 |
| 1557 | 2.0 | 140 | 100 | 94 |
| 1560 | 1.0 | 140 | 75 | 82 |

Figure 1:
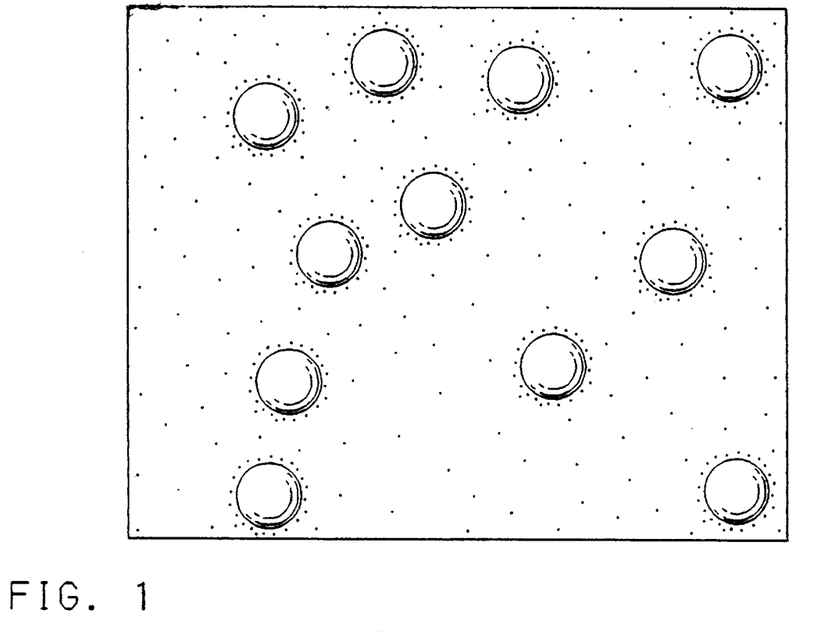
FIG. 1 is a drawing to scale of a scanning electron micrograph of sample 1557 (Example 1). The approximate magnification is 100,000.
Figure 2:
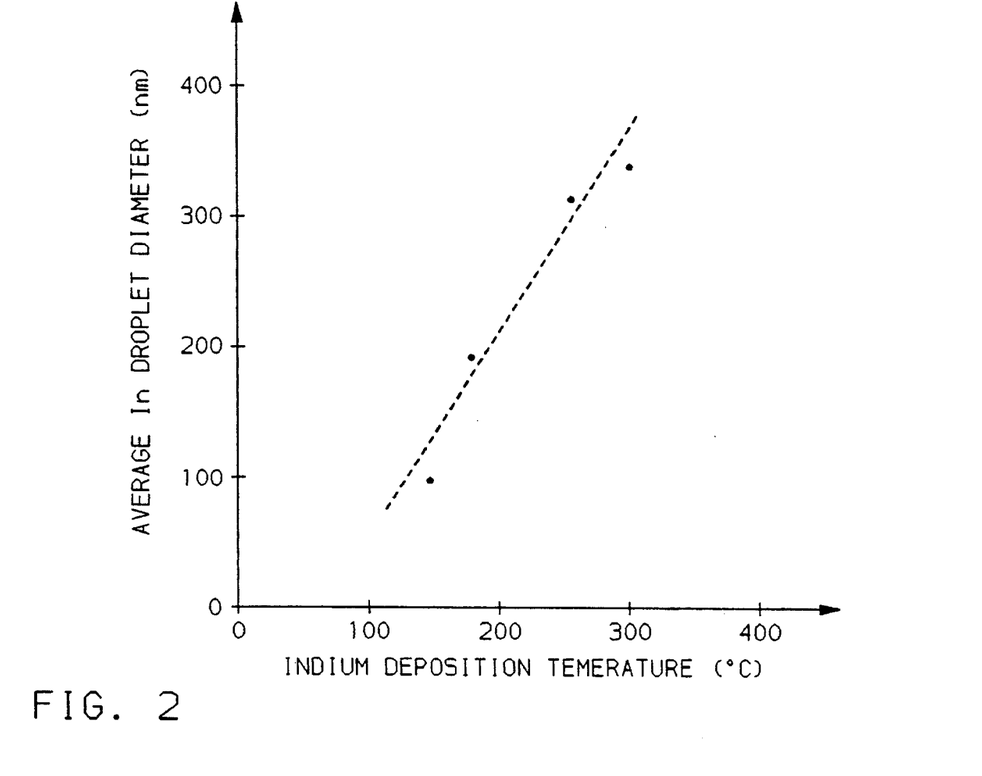
FIG. 2 is a graph of average indium (In) droplet diameter (vertical axis) versus sample temperature (°C.) during In deposition (horizontal axis). The average thickness of deposited indium with respect to the total deposition surface was 2.0 nm for each sample.

A drawing (to scale) of an SEM picture of sample number 1557 is shown in FIG. 1. As indicated in Table 1, the In droplets shown here were formed when 2.0 nm average In thickness was deposited at 140° C. onto an InSb epitaxial film. It can be seen that the droplets have a circular or nearly circular shape, have reasonably uniform diameters of 100 nm, and have a high areal density. Since the deposited indium was not spread over the entire indium antimonide film surface, but ultimately formed as droplets, the thickness or height of each droplet was greater than 2 nm. The three-dimensional shape of the droplets is essentially hemispherical. The average droplet diameter versus In deposition temperature is shown in FIG. 2 and listed in Table 1 for a wider range of samples. Note that the droplet diameter can be varied over a wide range by controlling the In deposition temperature. The lowest In deposition temperature studied so far of 140° C. is below the melting point of In, which is 156° C. This observation depends upon an accurate knowledge of the sample temperature, which was determined with an infrared pyrometer which was calibrated against the melting point of Bi (271° C.). Since 140° C. is 16° C. below the melting point of In, it is probably safe to say that the In was deposited below the melting point. The straight, dashed line in FIG. 2 is shown as a guide to the eye and does not necessarily imply that the droplet diameter is a linear function of temperature. From the available data in Table 1, it appears that the areal density of these droplets remains approximately constant for a given deposition temperature as the amount of In deposited increases but that their diameters increase. This implies that the areal droplet density is controlled by surface diffusion. In any event, as will become clear from my further disclosure, such droplets are inherently useful in the present invention as part of the final device structure (e.g., as contacts), or for making holes, or for other processing innovations.

The In droplets could be easily etched off from the surface using dilute HCl or HF acid solutions without appreciably etching the InSb film. SEM observations showed that holes were left in the InSb films where the In droplets had been, since part of the InSb film was dissolved by the In droplets. The diameter of these holes was consistent with the diameter of the In (and dissolved InSb) droplets which formed them. This illustrates one form of lithography according to the present invention.

EXAMLPE 2

In another illustration of the stalagraphy technique, 30 nm of $SiO_2$ was deposited onto sample 1553 (see Table 1). The deposition was done by thermal evaporation of SiO in a vacuum evaporator with $7 \times 10^{-5}$ torr $O_2$ during deposition. The sample was then heated to 200° C. in a hydrogen/nitrogen mixture at atmospheric pressure. This was done with the expectation that when the In droplets melted, they would crack the thin layer of $SiO_2$. The sample was then immersed in HCl acid solution. From SEM observations, it was clear that the HCl had etched away the In droplets and removed the $SiO_2$ that covered them, leaving the $SiO_2$ intact on the rest of the sample surface.

Thus, the $SiO_2$ layer can serve as a mask for subsequent etching of the InSb to form holes extending further below the positions where the In droplets had resided. This may be done by a variety of techniques. These include wet chemical etches such as (in parts by volume of standard solutions throughout each example) a solution of one part nitric acid and seven parts lactic acid. Another example would be 10 parts $H_2O$, one part $H_3PO_4$ and one part $H_2O_2$. Alternatively, one can use "dry" etching techniques, such as reactive ion etching (RIE). For example, a plasma formed by Ar, $H_2$ and an alkyl compound such as methane, ethane or propane will selectively etch the InSb. Chlorine-based plasma etching chemistries may also be used. Furthermore, the thickness of $SiO_2$ and thermal anneal temperature have not yet been optimized. If desired, the $SiO_2$ can then be removed by etching in HF.

Other coating materials may be used instead of $SiO_2$. Such examples include silicon nitride, Au and Ag. Use of elements such as Au depends to some extent on forming an alloy between it and the In droplets during a thermal anneal step, and then, ideally, on finding an appropriate chemical etch which will dissolve the alloy, but not the metal where it coats the InSb surface. In a preliminary experiment with a 20 nm thick layer of Au, the samples were heated to temperatures in the range of 200° C. to 300° C. and then etched with HCl. The Au-In droplets remained on the surface, but there appeared to be a ring of InSb that was removed around each droplet. To the extent that each droplet was thereby isolated electrically from the surrounding InSb, it may not matter that the droplets remain for some applications. The Au coating on the InSb may then be used as an etch mask while the exposed InSb is etched using one part $HNO_3$ and seven parts lactic acid or 10 parts $H_2O$, one part $H_3PO_4$ and one part $H_2O_2$. The Au mask may then be removed with an aqueous solution of KOH, KCN and $H_2O_2$. This process has not yet been optimized.

EXAMPLE 3

In another variation of stalagraphy, after the growth of InSb by MBE, the sample was cooled to 140° C., and 2.0 nm of In was deposited. The sample was then heated back up to 310° C. for 0.5 minute, and then cooled to room temperature. SEM pictures showed two types of features. There were $6 \times 10^7$ cm$^{-2}$ In droplets which had diameters of about 200 nm. There were also $8.5 \times 10^8$ cm$^{-2}$ empty holes where it appeared that In droplets had resided. In a few cases it appeared that the In had not been completely removed from the holes. Thus, it appears that an areal density of $9.1 \times 10^8$ cm$^{-2}$ of In droplets formed at 140° C. This is the sum of the "full" and "empty" sites observed and is consistent with the areal density of In droplets formed at 140° C. on other samples (see Table 1). The empty holes had diameters of 80 to 100 nm, again approximately in agreement with the droplet size reported in Table 1. Thus, it appears that as the sample with droplets on it was heated up to 310° C., the diffusion length of In increased, allowing In to condense into fewer droplets, reducing the total surface energy of In. Presumably, much of the Sb that had been dissolved into solution in these droplets from the InSb substrate was lost by evaporation as the In diffused out of the droplets. In view of the fact that some of the holes still had observable traces of indium in them, it appears that the time that the sample was at 310° C. was not adequate for this process to go to completion. Furthermore, the density of In droplets observed was three times higher and their diameters were smaller than the corresponding quantities observed for droplets deposited at 300° C., further supporting the view that a longer time at elevated temperatures might have produced even larger effects. This result illustrates additional capabilities for stalagraphy. For example, after creating droplets as just described and then removing most of them from their positions, leaving holes behind in the underlying film, a second film could be grown over this structure in the same growth apparatus without air exposure. If the second film was thin enough, it could probably be made to crack upon cooling where it covered the remaining In droplets, allowing it to be removed along with the In droplets with HCl or HF acid solution. This technique could be combined with another process discussed above in which the underlying film consists of two layers—a bottom, conductive layer and a top, high resistivity layer. The final (third), overlying layer could then be made to contact the bottom, conductive layer through the holes in the second, high resistivity or current-blocking layer.

EXAMPLE 4

Droplets on samples 1553 and 1557 (see Table 1) were etched with a solution of 10 parts $H_2O$, one part $H_3PO_4$ and one part $H_2O_2$ for 15 seconds. From previous observations, this removes 50 nm of InSb. From SEM observations, this etch did not appreciably affect the In droplets. From the minimal etching of the In droplets in the process, it is clearly possible to etch significantly deeper into the InSb with this etch using the In droplets as a mask. In a related experiment, after the etch described above, the In droplets were removed using HCl, leaving slightly raised circular InSb regions. These experiments illustrate ways to use stalagraphy to do "inverse" processing compared to the ones illustrated above.

There are very many variations on the stalagraphy processes described above. One is not restricted to depositing the droplets in-situ in a growth reactor, although this may be advantageous because of its simplicity.

Processes other than MBE for film growth, such as metal organic chemical vapor deposition (MOCVD) or liquid phase epitaxy (LPE) or the like, may be used. Droplets of materials such as In, Ga, Al, etc., may be deposited by thermally decomposing appropriate alkyl compounds, such as allane-trimethylamine adduct, $AlH_3N(CH_3)_3$ in the case of Al. Many other metal alkyls may be used, such as trimethylindium or triethylindium for In.

An advantage of ex-situ droplet formation is that materials can be used that might be undesirable contaminants or might not be available in a given growth reactor. Thus, materials such as Al, Ga, In, Tl, Sb, Bi, Ge, Sn, Pb, Zn, Cd and Hg are examples of low melting point materials that can be used for droplet formation on a variety of substrates. Note that some of these materials (e.g., Ge) melt at temperatures which are well above the melting point of some substrates of interest, such as InSb, but would be of interest on higher melting point substrates, such as Si. Droplets of elements with high vapor pressures at their melting points, such as Hg, Te, Se, S and P, are not excluded if they are formed in an appropriate environment, such as inside a growth system which uses these materials. Similarly, extremely reactive materials such as alkali, alkaline earth and rare earth elements may be used for droplets in an appropriate environment, such as the ultra high vacuum of an MBE system. Relatively high melting point materials such as Fe, Co, and Ni and the noble metals may be used on substrates of sufficiently high melting points.

The available data suggests that materials may form droplets below their melting points, which removes a further constraint, although the melting point generally provides a rough measure of the mobility of elemental species in bulk materials. However, an atom may be much more mobile on a surface that it weakly interacts with than in the bulk. In the particular case of In, the empirical straight line fit to the data in FIG. 2 suggests that the droplet diameter would be reduced to zero at a temperature of 100° C. below the melting point of In. This is 0.75 Tm, where Tm is the melting point of In on the Kelvin temperature scale. However, the droplet size depends on many substrate-related factors, and not just on temperature and the diffusing specie. Isolated atoms which have been deposited onto a sample surface initially interact with the sample surface much more strongly and frequently than with each other. Furthermore, as these atoms diffuse across the surface and condense to form very small droplets, the possibility of forming a relatively low melting eutectic composition with the substrate exists.

Alloys of elements may also be useful for using one droplet species to dissolve or modify the properties of another species. For example, a species such as In may be used to form droplets of a desired areal density, size, etc. These droplets may be independently "doped" with a desired concentration of a second species such as Sn or Te which in turn dopes the adjacent semiconductor, such as InSb, to a desired concentration. This gives a new degree of control to dopant properties and effects. Or, two species may be deposited which together form a low melting temperature eutectic composition. In general, the droplet diameter, height (above the otherwise flat surface of the sample), areal density, average distance between droplets, composition and position relative to other surface features and the degree of variation of these quantities among different droplets on the same sample are important variables that are to be optimized for any given material system and/or device application. Important parameters for this droplet engineering may include droplet composition, deposition temperature, deposition rate, average deposited thickness of droplet material, substrate crystallographic orientation, presence of nearby mesa structures or protuberances or depressions on the substrate, surface roughness and surface composition. Regarding surface composition, growth of only one or a few monolayers of a foreign substance (e.g., AlSb or GaSb, or an oxide) over InSb might substantially influence droplet properties.

The context of the present invention for illustration purposes has so far been that of single crystal substrates or films. However, stalagraphy has a much more general applicability to amorphous and polycrystalline materials, such as amorphous silicon and its alloys, polycrystalline silicon, oxides and nitrides of silicon, photoresist, polymers, glass, metal, etc. It may be used in conjunction with a wide range of processes, some of which are suggested here. In short, stalagraphy opens up a new dimension of possibilities in terms of fabricating materials and devices with features roughly in the micrometer to the nanometer range. While many of the structures which may be made with stalagraphy could be made by other techniques, stalagraphy is an inherently manufacturable process which lends itself well to low cost mass production, and in some of its versions it also inherently integrates defining small structures with creation of them.

Figure 3A:
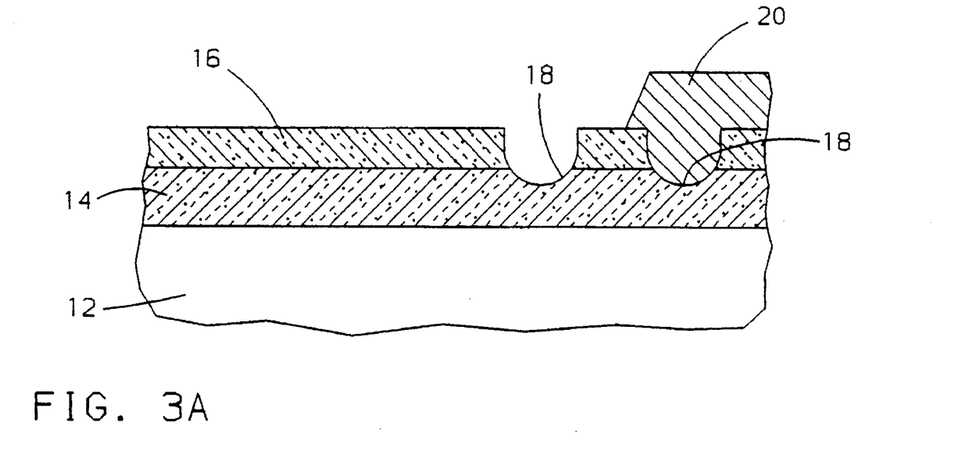
FIGS. 3A, 3B and 3C are cross-sectional views of magnetic field sensor semiconductor structures showing in 3A an example in which the ohmic contact is on the active layer and no "top" layer is used; 3B an example of a three-layer structure where the ohmic contact is made to the active layer through holes left by droplets; and 3C is an example of a two-layer structure in which an insulator and an overlying ferromagnetic material are deposited in regions formerly occupied by droplets.
Figure 3B:
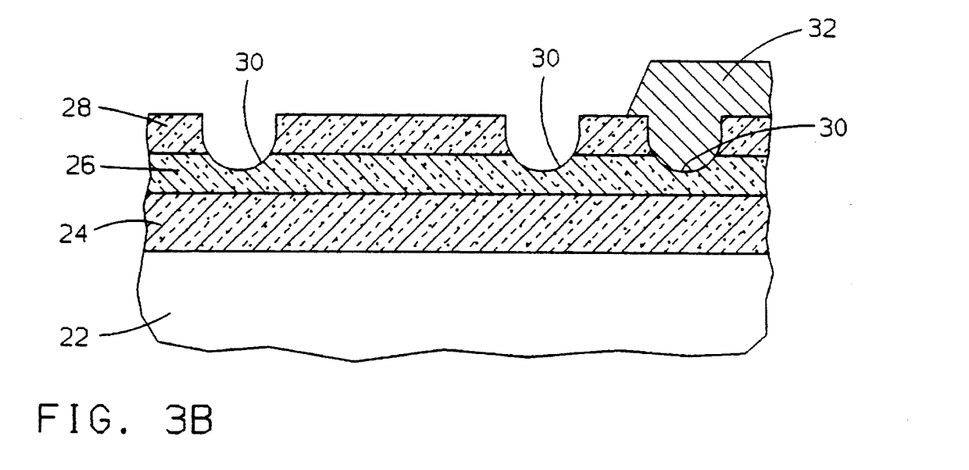
Figure 3C:
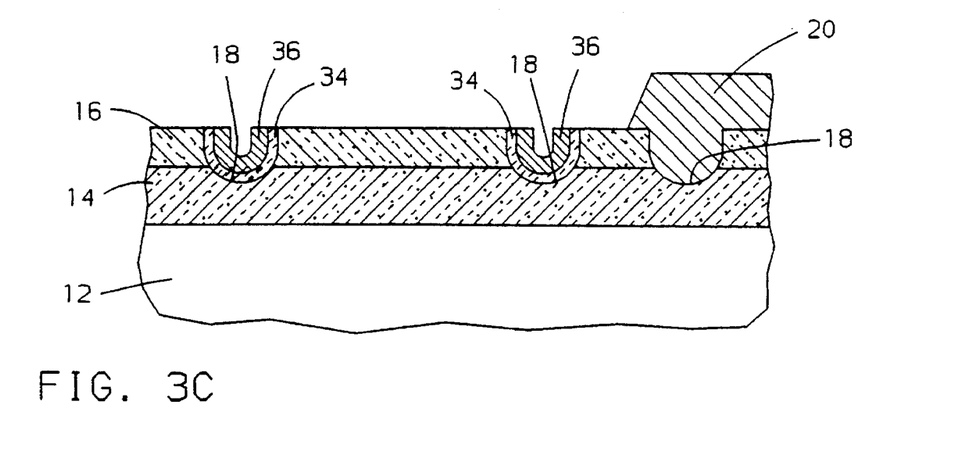

Table 2 below lists a few particular examples of material systems which may be of interest for certain device applications. The designations of "substrate", "buffer", etc., refer to FIG. 3. The meanings of these designations both in semiconductor structures generally and in semiconductor magnetic field sensor structures as known by workers in the art are as follows. The substrate is typically a thin, flat component of suitable crystal structure oriented single crystal material upon which other materials (films, etc.) of the device are formed. The substrate is often an electrical insulator and is the supporting or mechanical structural element of the device. The active layer is a layer in which a function or operation of the device is performed. It is, e.g, the layer which functions as a laser, or in which an electrical response to a magnetic field is observed, or in which an n-p junction is formed. A buffer layer is a layer employed, e.g., between the substrate interface and active layer to accommodate differences in crystal lattice constants, other crystal differences and/or electrical differences. It is noted that Bi-Sb alloy may be a semiconductor or a semi-metal, depending upon its composition. It will be referred to here as a semiconductor for simplicity. Also, narrow energy band gap semiconductors such as Bi-Sb or InSb may exhibit substantial n-type conductivity even if they are chemically undoped or lightly doped with p-type (acceptor) impurities.

TABLE 2

| Preferred In-Situ Droplet Materials | Top Layer | Active Layer | Buffer Layer | Substrate |
|---|---|---|---|---|
| In, Al, Ga, Bi, Tl, Sn, Pb | | InSb, (InGa)Sb, In(AsSb) | | GaAs, InP, Si |
| In, Al, Ga, Bi, Tl, Sn, Pb | | InSb, (InGa)Sb, In(AsSb) | (InAl)Sb or (InGa)Sb | GaAs, InP, Si |
| In, Al, Ga, Bi, Tl, Sn, Pb | (InAl)Sb | InSb, (InAl)Sb or In(AsAb) | (InAl)Sb or (InGa)Sb | GaAs, InP, Si |
| In, Al, Ga, Bi, Tl, Sn, Pb | (AlGa)Sb | InAs | (AlGa)Sb | GaAs, GaSb |
| In, Al, Ga, Bi, Tl, Sn, Pb | InP or (InAl)As | (InGa)As | InP or (InAl)As | InP, GaAs |
| In, Al, Ga, Bi, Tl, Sn, Pb | (AlGa)As | GaAs | (AlGa)As | GaAs, Si |
| In, Al, Ga, Bi, Tl, Sn, Pb | (AlIn)P | (GaIn)P | (AlIn)P | GaAs |
| Sn, Tl, Ga, In | | Bi—Sb alloy | | BaF$_2$, CdTe |
| Sn, Tl, Ga, In | (InAl)Sb | Bi—Sb alloy | (InAl)Sb | GaAs, InP, Si |
| Sn | | Ge | | Ge, Si |
| Sn, Ge | | Si | | Si |
| Sn, Ge, Si | | C | | C, SiC, Si |

The preferred in-situ droplet materials refer to materials which may be more accelltable for use inside a growth reactor for a given material by virtue of either not being a dopant or of not having a very large vapor pressure. As noted above, it may be that one wants droplets composed of an n-type or p-type dopant for a given application, such as those involving contact formation. Excessive use of a high vapor pressure dopant species in a growth reactor might cause cross-contamination or "dopant memory" problems. This may be addressed by transfer from one growth chamber to another, without air contact.

EXAMPLES OF STRUCTURES MADE BY STALAGRAPHY

FIGS. 3A, 3B and 3C shows three cross-sectional views of magnetic field sensor structures which could be made using materials such as those shown in Table 2. These sensors to some extent follow the concepts of U.S. Pat. No. 5,038,131 entitled "Magnetoresistor" by C. H. Olk and J. P. Heremans, in which a change in resistance occurs when a magnetic field is applied perpendicularly to the plane of the device and is of such a magnitude that electron flow through the film between the contacts must be in a substantially circular path around the openings. The disclosure of U.S. Pat. No. 5,038,131 is incorporated into this specification by reference thereto. While that patent involved ordered arrays of holes in the film carrying the electron current, the present process involves a random, or semi-random pattern of holes created by the stalagraphy process. Furthermore, the cited patent involved a two terminal device having a pair of conductive contacts at opposite ends of the film. Many such two terminal sensor elements may be joined in series in integrated form on a single substrate to increase sensor resistance, which decreases power consumption.

In the present invention, the magnetoresistor device may have two contacts, with again many such integrated devices joined in series. Alternatively, more than two contacts may be used on a single sensor element, in which additional contacts are used to sense the Hall voltage, which allows the polarity of the magnetic field to be sensed in addition to its magnitude. A three terminal MAGFET structure or a four terminal Hall effect structure may be used to sense field polarity.

Such two or three terminal devices could equally well be used in the present context with features as illustrated in FIGS. 3A, 3B and 3C. The cited patent by Olk and Heremans is based on matching cyclotron orbits to holes in the active layer. These holes may be actual physical holes or they may be "electrical" holes in the sense that they may be composed of materials which exclude electrons from them. It is noted that other physical effects, such as the Ahronov-Bohm effect, may also come into play in affecting electron transport through the devices shown in FIG. 3. In this latter effect, electrons can travel around each hole in two ways, "clockwise" or "counter clockwise". Constructive or destructive interference effects may be observed in the electron wavefunctions as they traverse the region around each hole. These interference effects are a sensitive function of the magnetic field in the direction perpendicular to the plane of the device. Both cyclotron and Ahronov-Bohm effects depend upon electrons with a long mean free path, so that collisions with defects do not destroy the coherence of electron motions. This requirement tends to favor materials such as InSb, GaAs, and their alloys which have small carrier effective masses. While much of the discussion which follows is stated in terms of cyclotron effects, it is not meant to exclude Ahronov-Bolhm effects from consideration.

The semiconductor structures illustrated in FIGS. 3A, 3B and 3C are similar in that critical structures were shaped by first forming a droplet on a material surface and then etching or otherwise removing the droplet to leave a useful hole (negative structural element). The structure in FIG. 3A comprises substrate 12 (e.g., GaAs), buffer layer 14 (e.g., (InAl)Sb) and active layer 16 (e.g., InSb). No "top" layer was grown. Droplets of, e.g., In have been formed and removed from the active layer 16 and buffer 14 of the device by chemical etching or by the high temperature anneal step discussed above. The active layer 16 is doped, preferably n-type. The donors may be dispersed in the active layer or they may be put into the upper portion of the buffer layer in a thin region close to the active layer. If the buffer layer has an appropriate conduction band offset relative to the active layer (in most cases this condition is satisfied if the energy band gap of the buffer layer is larger than that of the active layer), the electrons will tend to transfer from the region of the donors to the immediately adjacent portion of the active layer. This is generally known as modulation doping and tends to give higher electron mobilities and longer mean free paths than "bulk" or uniform doping of the active layer because of reduced scattering of electrons by ionized donors. The holes 18 shown in FIG. 3A go all the way through the active region 16, although in some cases of bulk-doped active layers they might only have to go part way through. This would be the case, for example, if the depletion region that typically accompanies band bending at the surface of a semiconductor extended from the bottom of the holes to the buffer layer 14. Ohmic contact 20 utilizes one or more of holes 18. The buffer layer 14 typically has a relatively high resistivity as does the substrate 12 for magnetic field sensors. This prevents them from shorting out the active layer 16.

Alternatively, the substrate could be conductive if the buffer layer itself provides adequate isolation from it. The buffer layer also generally serves the function of removing the active region from the substrate surface, which may have objectionable roughness, impurities and a different crystal lattice spacing from the active region. In many cases, the buffer layer may have the same chemical composition as the active layer except that the buffer layer is undoped, or very lightly doped n-type or p-type. It may even be eliminated if defects from the substrate are not a problem. It may be possible to grow a number of these materials on Si substrates with good device properties.

If the active layer is bulk doped, the optimal electron density would be in the range of $4 \times 10^{16}$ cm$^{-2}$ to $5 \times 10^{18}$ cm$^{-2}$. Especially for the lower part of this doping range, depletion effects under the ohmic contacts can cause high contact resistances. To alleviate this problem, the topmost portion of the active layer may be doped roughly an order of magnitude higher to a depth which depends on the doping level, but may be 10–50 nm (U.S. Pat. No. 5,153,557 entitled "Magnetic Field Sensor Contacts" by D. L. Partin and J. P. Heremans).

The depth of the holes left by the droplets may be deepened by the chemical etching procedures discussed above if desired. This would become more important the thicker the active region is made. The deposition conditions of the droplets and subsequent processing need to be chosen. For most active region materials listed in Table 2 (except for InAs), the carriers would deplete from the surface a distance related to the dopant density. Thus, the electrons making circular orbits around the holes would ideally have orbital diameters of approximately the hole diameter plus twice the depletion depth or thickness. Thus, the diameter of the holes and the doping level need to be adjusted to give correct orbits in the range of magnetic fields which it is desired to detect. This is one reason why the dopant range cited goes higher than normal for conventional InSb magnetoresistors, since this would minimize depletion effects around the holes. These higher doping levels would also minimize depletion effects from the top surface of the active region. This would be important for minimizing how deep the holes have to go and would therefore be more useful for relatively thin active regions. The droplets could be removed from the region under the ohmic contacts or left in place, as desired. For automotive applications involving device operating temperatures above the melting point of In, it is generally preferable to remove them as shown. The contact metallization could consist, for example, of Au—Ge or Au—Sn alloy, coated with Ni and Au.

In FIG. 3B, a structure with a top layer 28 is shown, which may be useful for modulation doping the active layer 26, for passivating the active layer 26, or for influencing droplet size and density. The holes 30 shown are just penetrating through the top layer, and therefore are more appropriate for the case of modulation doping from the top layer 28. For example, the top layer 28 could be (AlGa)As, and the active layer 26 could be GaAs. The buffer layer 24 could be GaAs or (AlGa)As with a GaAs substrate 22. Ohmic contact 32 is shown formed. in one or more former holes 30.

In this case, depletion effects could remove electrons from the region under the hole 30, and a two-dimensional electron gas of electrons would carry the electrical current. A variant of this structure would be that the droplets, which might be formed from Ga or Al, could be converted to their respective arsenides by causing arsenic to impinge on the surface. The intent here is not to duplicate droplet epitaxy by forming well-oriented microcrystals on top of the surface, but to seal up the holes 30 against subsequent atmospheric exposure. Note that the holes 30 under the ohmic contacts 32 are used to get access to the underlying active layer in the structure in FIG. 3B. Alternatively, the top layer 28 could be etched away from the contact region 32 and/or ion implantation could be used to make the top 28 and/or active 26 layers heavily n-type. Well-known selective chemical etches could be used to advantage for the GaAs/(AlGa)As material system to extend the holes 30 and/or contact regions down to the GaAs layer, if desired. Note that a thin GaAs layer is often grown on top of the "top" (AlGa)As layer in a high electron mobility structure of GaAs/(AlGa)As and doped appropriately with a donor in the adjacent (AlGa)As or in the topmost GaAs layer to reduce surface depletion effects. This topmost GaAs layer could be used on the structure in FIG. 3B. The structure in FIG. 3B has been discussed in connection with the (AlGa)As material system. This is done to illustrate the variety of materials which can be used to make devices using stalagraphy.

FIG. 3C shows a structure similar to that of FIG. 3A, except that ferromagnetic material 36 is added, such as Fe, Co, Ni, ferrites or permalloy. Techniques for using stalagraphy to fabricate such a structure were discussed earlier. Since some of these ferromagnetic materials are electrically conductive, an optional thin film of an insulator 34, such as an oxide, is shown under the ferromagnetic material 36. This ferromagnetic material 36 would tend to concentrate the magnetic field in the region of each hole 18. The ferromagnetic material could be left in the holes 18 under the ohmic contacts 20 or not, as desired. Other aspects of this structure are similar to the case for FIG. 3A. Note that the structure in FIG. 3B could also be modified to use ferromagnetic materials in the holes 30.

Figure 4A:
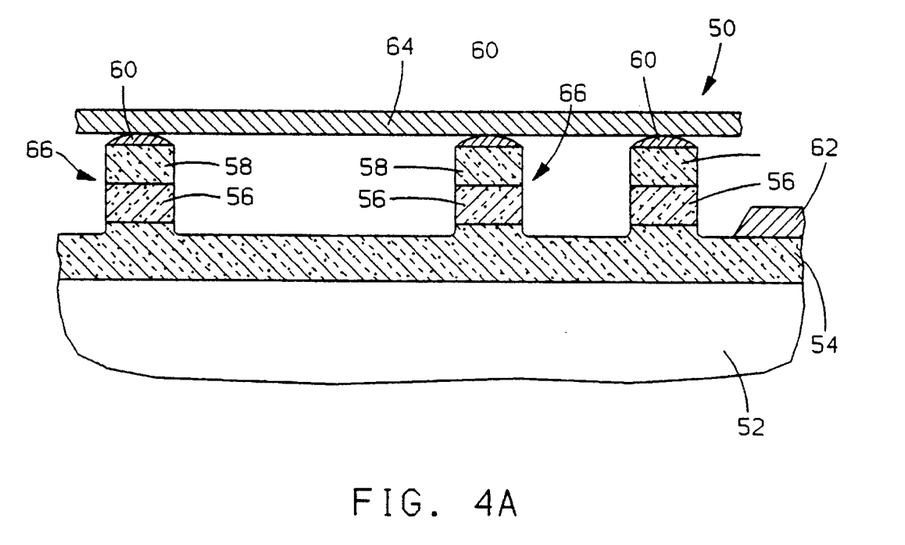

Quantum wire structures are very small structures that have electrons confined so that they are only able to transport electrical current in one dimension. Such a device may be very sensitive to a magnetic field, especially in the direction perpendicular to the wires. Such a structure 50 comprising several wires 66 is shown in FIG. 4A. The overall structure 50 comprises substrate 52, buffer layer 54, an active layer 56, a contact layer 58, droplets 60 and ohmic contact 62. Metal "plate"64 electrically connects all of the droplets 60 together. Thus, each wire 66 includes a droplet 60 portion, a contact layer 58 portion, an active layer 56 portion and a buffer layer 54 portion. The structure is shown in its finished condition. However, obviously the droplets 60 were initially deposited and formed on flat, full layers of contact, active and buffer material coextensively overlying substrate 52. The wires 66 with the droplets 60 at their upper ends were formed by removing the portions of layers 58 and 56 around droplets 60 to leave the upstanding wire structures 66.

The structure 50 may be fabricated using a wet or dry chemical etching procedure which etches around the droplets 60 significantly slower than the underlying film. The film may be composed of a single layer doped n-type or p-type heavily enough so that it does not completely deplete from the cylindrical surfaces. Allowance must also be made for any material which is reacted (i.e., converted to oxide or other insulator). In FIG. 4A, the film is composed of three layers (54, 56 and 58). Layer 1 is a buffer layer 54, which may be heavily doped to reduce spreading resistance. Layer 2 is the active layer 56, and layer 3 is the contact layer 58, which again is heavier doped to reduce contact resistance. All layers are of the same conductivity type (n-type or p-type), although n-type layers are generally preferred. In a like but slightly different variation, the buffer layer and/or the contact layer are deleted. A metal plate electrically connects all of the droplets together, bonding to the droplets through temperature and/or pressure. The metal plate may be a metal film on the bottom surface of a silicon or GaAs wafer (not shown in the figure). The two device terminals are formed between the metal plate 64 and contact 62 which is on the buffer layer 54. It is generally desired that the substrate 52 be insulating, especially if more than one such device is to be connected in series in integrated form on a single substrate. This would serve to increase the resistance of this magnetic field sensor 50.

Figure 4B:
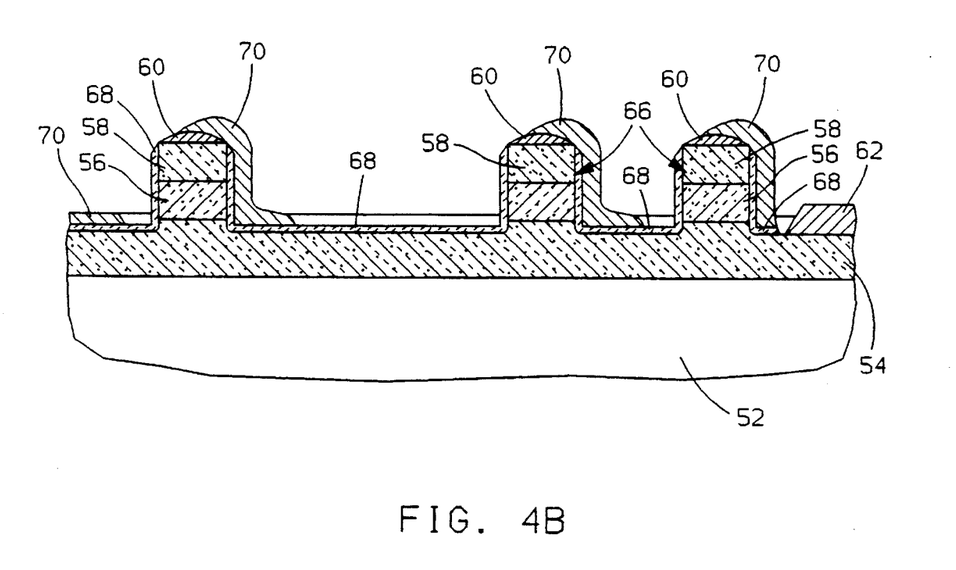

A variation on this is shown in FIG. 4B. Most aspects of this structure are the same as those shown in FIG. 4A. A dielectric layer 68 such as an oxide has been grown or deposited over the exposed surfaces as previously discussed. The droplets 60 are shown still on the surface in the figure. However, it may be necessary to remove them (e.g., in case this is necessary to remove an overlayer of $SiO_2$). Either way, a layer of metallization 70 is deposited over the device. If the droplets are removed, then this layer of metallization makes contact with the tops of the quantum wires. As shown in FIG. 4B, the deposited metallization 70 only coats the wires 66 on one side, but it forms a continuous conductive path on dielectric 68, although it does not necessarily cover all of the dielectric layer 68. That is, the "shadows" of the quantum wires do not extend all the way across the sample. Finally, it is noted that in the case in which InAs is used for the active layer material, it need not be doped, since its surface is accumulated with electrons rather than depleted of them. This relaxes some of the constraints on doping levels discussed above. A buffer layer (of (AlGa)Sb, as listed in Table 2) could be used, or an undoped layer of InAs could be grown directly on an InP, GaAs, or possibly a Si substrate. This is because after growing an adequately thick InAs layer, the density of defects such as dislocations falls to a relatively low level. As is the case for FIG. 4A, many devices configured as in FIG. 4B could be connected in series in integrated form on a single substrate.

Quantum dot structures have electrons confined in three dimensions which greatly alters the electronic and optical emission properties of the material, with a large potential improvement in optical emission properties. While FIGS. 4A and 4B were oriented towards magnetic field sensors, the same basic structures could be used to make quantum dot light emitting devices. Not all materials shown in Table 2 have the correct band structure for efficient light emission, although most of them do. Even indirect bandgap materials such as Si and Ge may emit light under certain conditions when fabricated with porous surfaces. Note that very small structures could be made in Ge and Si using stalagraphy using nanometer-sized droplets. In the structures shown in FIGS. 4A and 4B, the substrate may be insulating or conductive. The buffer layer 54 (layer 1) may be n-type or p-type. Layer 2 is the active layer 56 and may be n-type or p-type. Layer 3 is the "top" layer 58 (see Table 2). It is doped with the opposite conductivity type from the buffer layer so that a p/n junction is formed at the top or bottom surface of the active layer. This p/n junction may be forward biased to generate light. The light can escape out of the uncoated side of each quantum box in FIG. 4B. In FIG. 4A, the metal plate could be semitransparent using, e.g., conductive $In_2O_3$ as the conductor. Or the light could escape out of either structure shown in FIG. 4, if it was transparent at the wavelength generated. The contact resistances could in many cases be reduced if two additional layers are grown. A "contact" layer could be grown on top of the "top" layer which has the same composition as the active layer, except that it is heavily doped to be of the same conductivity type as the "top" layer. The buffer layer could also be composed of two layers, with the bottom layer which is in contact with the substrate being of the same composition as the active region, except that it is heavily doped to be of the same conductivity type as the rest of the buffer layer. The "contact 2" is then made to this bottom, heavily-doped layer. These improvements are due to the fact that the active region in these structures generally has the lowest energy band gap and hence the lowest Schottky barrier height. This facilitates making low resistance ohmic contacts to heavily doped material. Alternatively, if the substrate is conductive with the same conductivity type as the buffer layer, contact 2 could be made directly to it. The process of forming a dielectric layer, contacting the droplets or the top layer, etc., are similar to the processes previously discussed.

The list of materials given in Table 2 is in no sense meant to be exhaustive and does not exclude structures involving, e.g., II–VI materials such as (HgCd)Te/CdTe and ZnSe/Zn(MgSe), IV–VI materials such as PbTe/(PbEu)(SeTe), or III–V materials such involving other phosphides or nitrides (BN, AlN, GaN, InN) and their alloys. Not all of these materials would necessarily be suitable or optimal for magnetic field sensors or for light emitting devices. However, these are included to illustrate the wide range of applicability of stalagraphy.

While my invention has been described in terms of specific embodiments, it will be appreciated that other forms and practices could be adapted by one skilled in the art. Accordingly, the scope of my invention is intended to be limited only by the following claims.

The embodiments of the invention in which an exclusive property or privilege is claimed are defined as follows:

1. A method of making micron-sized or smaller holes in a surface of a material, comprising:

providing a first material in a deposition chamber, said material having a surface for receiving a deposit of a second material to be utilized in the formation of said holes, depositing said second material on said surface while controlling the quantity of material deposited and the temperature of said surface so that said second material ultimately forms discrete droplets after deposition on said surface, a portion of the material of said droplet diffusing into and mixing with underlying first material, said droplets having diameters on the order of one micron or smaller, and thereafter removing at least some of said droplets and intermixed first material from said surface to form said holes therein.

2. A method as recited in claim 1 in which the second material forms droplets with an areal density of the order of $10_6$ droplets per square centimeter to $10^{10}$ droplets per square centimeter.

3. A method as recited in claim 1 in which droplets and intermixed first material are removed by chemical etching.

4. A method as recited in claim 1 in which droplets and intermixed first material are removed by evaporation.

5. A method as recited in claim 1 comprising heating the droplets after deposition on said surface such that some droplets and intermixed first material are removed by diffusion to form said holes and a smaller number of larger droplets than initially formed.

6. A method of making micron-sized or smaller physical holes on a surface of a semiconductor device, comprising:

providing a first material for said semiconductor device, said material having a surface for receiving a deposit of a second material to be utilized in the formation of said holes, depositing said second material on said surface while controlling the quantity of material deposited and the temperature of said surface so that said second material forms discrete droplets after deposition on said surface, a portion of the material of said droplet diffusing into and mixing with underlying first material, said droplets having diameters on the magnitude of one micron or smaller and having an areal density in the range of about $10^6$ to $10^{10}$ droplets per square centimeter, and thereafter removing at least some of said droplets and intermixed first material from said surface to form said holes therein.

7. A method as recited in claim 6 in which the first material comprises a film of a group III–V semiconductor compound material and in which method the deposited second material comprises one or more elements selected from the group consisting of indium, aluminum, gallium, bismuth, tin, lead, thallium, germanium and silicon.

8. A method as recited in claim 6 in which the first material surface layer portion comprises a film of bismuth-antimony alloy and the deposited second material comprises an element selected from the group consisting of gallium, indium, thallium and tin.

9. A method as recited in claim 6, 7 or 8 where some of said droplets remain on said surface and a third material is deposited as a layer overlying said remaining droplets.

10. A method as recited in claim 6, 7 or 8 where some of said droplets remain on said surface and a third material is deposited as a layer overlying and electrically interconnecting said remaining droplets and said holes.

11. A method as recited in claim 6 comprising providing a first material comprising a surface layer and at least one layer underlying said surface layer, depositing said second material on said surface layer such that the formed droplets dissolve at least a portion of the material through the thickness of the underlying surface layer.

12. A method as recited in claim 11 in which droplets are chemically etched from said surface layer such that said droplets and at least part of said surface layer portion underlying said droplets are removed to leave holes in the surface of said first material.

13. A method as recited in claim 11 in which droplets are etched from said surface layer such that said droplets and said surface layer portion underlying said droplets are removed to form hole structures in said first material to a depth of at least the full thickness of said surface layer portion.

14. A method of making semiconductor structures on a surface, comprising:

providing a first material for said semiconductor structures, said material comprising a surface layer having high electrical resistivity or p-type conductivity, a layer underlying said surface layer and having n-type conductivity and an electrically insulating substrate, depositing a second material on said surface layer while controlling the quantity of material deposited and the temperature of said surface so that said second material forms discrete droplets after deposition on said surface, said droplets having diameters on the magnitude of one micron or smaller and having an areal density in the range of about $10^6$ to $10^{10}$ droplets per square centimeter, said second material being of a composition that dopes and/or alloys with the portion of said surface layer underlying each droplet to convert the electrical property of said underlying portions to n-type conductivity or to be substantially more conductive to electrons, optionally removing portions of said droplets that were unused in said alloying or doping to expose the said converted underlying portions, and depositing a layer of third material of metal or a semiconductor of n-type conductivity over said droplets and/or the exposed areas of said surface layer, whereby conductivity paths between said underlying layer and said third material layer are formed through the doped or alloyed portions of said surface layer and said droplets.

15. A method as recited in claim 14 in which the said layer underlying said surface layer is a composition selected from the group consisting of indium antimonide, indium arsenide antimonide, indium gallium antimonide, indium arsenide, gallium arsenide, indium gallium arsenide, bismuth or bismuth-antimony.

16. A method as recited in claim 14 in which said surface layer is a composition selected from the group consisting of indium aluminum antimonide, gallium arsenide, gallium aluminum arsenide, aluminum indium arsenide, indium phosphide or cadmium telluride.

17. A method as recited in claim 14 in which the said second material is one or more elements selected from the group consisting of indium, gallium, bismuth, tin, lead, mercury, tellurium or antimony.

18. A method as recited in claim 14 in which the said third material is a composition selected from the group consisting of indium antimonide, indium arsenide antimonide, indium gallium antimonide, indium arsenide, gallium arsenide, indium gallium arsenide, bismuth, bismuth-antimony, indium, tin, gold, silver, aluminum, copper or antimony.

* * * * *